US008840724B2

(12) United States Patent
Grigorian et al.

(10) Patent No.: US 8,840,724 B2
(45) Date of Patent: Sep. 23, 2014

(54) CONTINUOUS GROWTH OF SINGLE-WALL CARBON NANOTUBES USING CHEMICAL VAPOR DEPOSITION

(75) Inventors: Leonid Grigorian, Raymond, OH (US);
Louis Hornyak, Evergreen, CO (US);
Anne C. Dillon, Boulder, CO (US);
Michael J. Heben, Denver, CO (US)

(73) Assignee: Honda Motor Co., Ltd., Tokyo (JP)

( * ) Notice: Subject to any disclaimer, the term of this patent is extended or adjusted under 35 U.S.C. 154(b) by 191 days.

(21) Appl. No.: 12/236,144

(22) Filed: Sep. 23, 2008

(65) Prior Publication Data

US 2009/0013931 A1    Jan. 15, 2009

Related U.S. Application Data

(62) Division of application No. 10/700,386, filed on Nov. 3, 2003, now Pat. No. 7,431,965.

(60) Provisional application No. 60/422,860, filed on Nov. 1, 2002, provisional application No. 60/444,979, filed on Feb. 5, 2003.

(51) Int. Cl.
| C23C 16/00 | (2006.01) |
| C30B 29/60 | (2006.01) |
| B82Y 30/00 | (2011.01) |
| C23C 16/455 | (2006.01) |
| C30B 35/00 | (2006.01) |
| C30B 25/18 | (2006.01) |

(52) U.S. Cl.
CPC ............... C30B 25/18 (2013.01); C30B 29/602 (2013.01); B82Y 30/00 (2013.01); C23C 16/45576 (2013.01); C30B 35/00 (2013.01)
USPC ................. 118/715; 156/345.33; 156/345.34; 428/304.4

(58) Field of Classification Search
CPC .......... B82Y 5/00; B82Y 30/00; B82Y 35/00;
C30B 35/00; C30B 29/602; C30B 29/605;
C30B 29/607; C30B 29/62; C30B 29/64;
C30B 29/66; C30B 25/18; C01B 31/02;
C01B 31/022; C01B 31/0226; C01B 31/0233
USPC .................. 118/715; 156/345.33, 345.34
See application file for complete search history.

(56) References Cited

U.S. PATENT DOCUMENTS

| 4,942,844 | A | * | 7/1990 | Pinkhasov | 118/723 VE |
| 6,107,225 | A | * | 8/2000 | Shobu et al. | 501/92 |
| 6,692,717 | B1 | * | 2/2004 | Smalley et al. | 423/445 B |
| 2002/0172767 | A1 | * | 11/2002 | Grigorian et al. | 427/255.28 |
| 2003/0107024 | A1 | * | 6/2003 | Tai et al. | 252/500 |
| 2005/0074392 | A1 | * | 4/2005 | Yang et al. | 423/447.3 |

FOREIGN PATENT DOCUMENTS

| EP | 1 061 041 | 12/2000 |
| JP | 3007983 | 3/2000 |
| JP | 2002-255519 | * 9/2002 |
| WO | WO 89/07163 | 8/1989 |
| WO | WO 00/17102 | 3/2000 |

OTHER PUBLICATIONS

Bandow, S. et al., "Effect of the Growth Temperature on the Diameter Distribution and Chirality of Single-Wall Carbon Nanotubes," *Physical Review Letters*, 1998, vol. 80, No. 17, pp. 3779-3782.
Colomer, J.-F. et al., "Large-scale Synthesis of Single-wall Carbon Nanotubes by Catalytic Chemical Vapor Deposition (CCVD) Method," *Chemical Physics Letters*, 2000, vol. 317, pp. 83-89.
Dillon, A. et al., "A Simple and Complete Purification of Single-Walled Carbon Nanotube Materials," *Advanced Materials*, 1999, vol. 11, No. 16, pp. 1354-1358.
Guo, T. et al., "Catalytic Growth of Single-Walled Manotubes by Laser Vaporization," *Chemical Physics Letters*, 1995, vol. 243, p. 49-54.
Iijima, S., "Helical Microtubules of Graphitic Carbon," *Nature*, 1991, vol. 354, pp. 56-58.
Kroto, H.W., "$C_{60}$: Buckminsterfullerene," *Nature*, 1985, vol. 318, pp. 162-163.
Su, M., "A Scalable CVD Method for the Synthesis of Single-walled Carbon Nanotubes with High Catalyst Productivity," *Chemical Physics Letters*, 2000, vol. 322, pp. 321-326.

Thess, A. et al., "Crystalline Ropes of Metallic Carbon Nanotubes," *Science*, 1996, vol. 273, pp. 483-487.

Wang, M. et al., "Carbon Nanotubes Grown on the Surface of Cathode Deposit by Arc Discharge," *Fullerene Science and Technology*, 1996, vol. 4, p. 1027-1039.

\* cited by examiner

*Primary Examiner* — Parviz Hassanzadeh
*Assistant Examiner* — Satish Chandra
(74) *Attorney, Agent, or Firm* — Mark Duell; Fenwick & West LLP

(57) ABSTRACT

The invention relates to a chemical vapor deposition process for the continuous growth of a carbon single-wall nanotube where a carbon-containing gas composition is contacted with a porous membrane and decomposed in the presence of a catalyst to grow single-wall carbon nanotube material. A pressure differential exists across the porous membrane such that the pressure on one side of the membrane is less than that on the other side of the membrane. The single-wall carbon nanotube growth may occur predominately on the low-pressure side of the membrane or, in a different embodiment of the invention, may occur predominately in between the catalyst and the membrane. The invention also relates to an apparatus used with the carbon vapor deposition process.

6 Claims, 1 Drawing Sheet

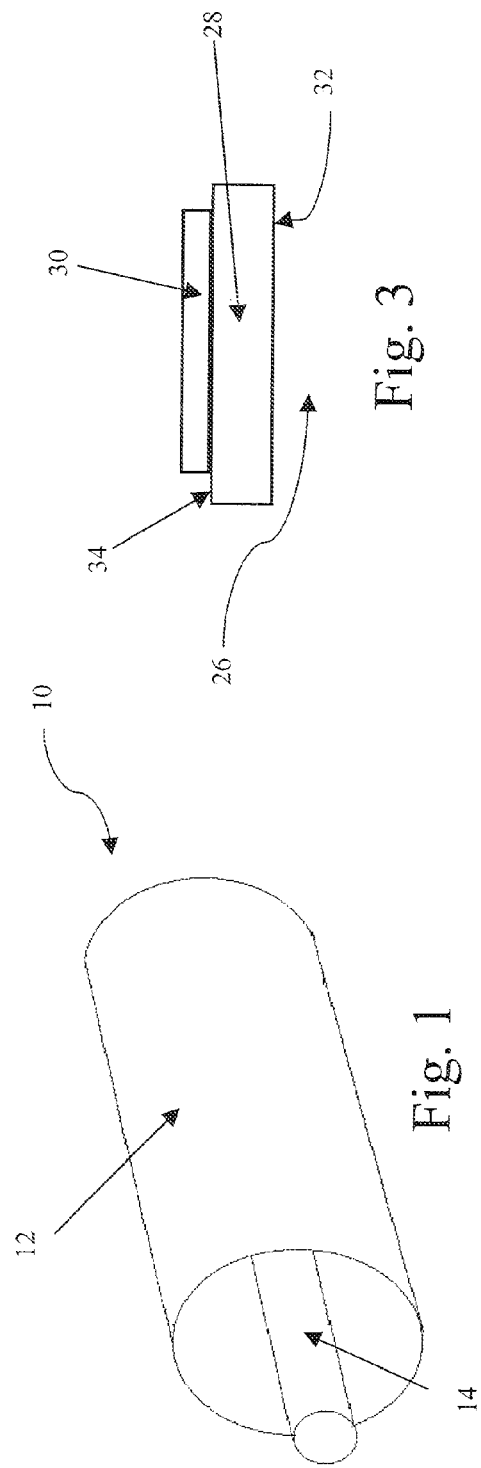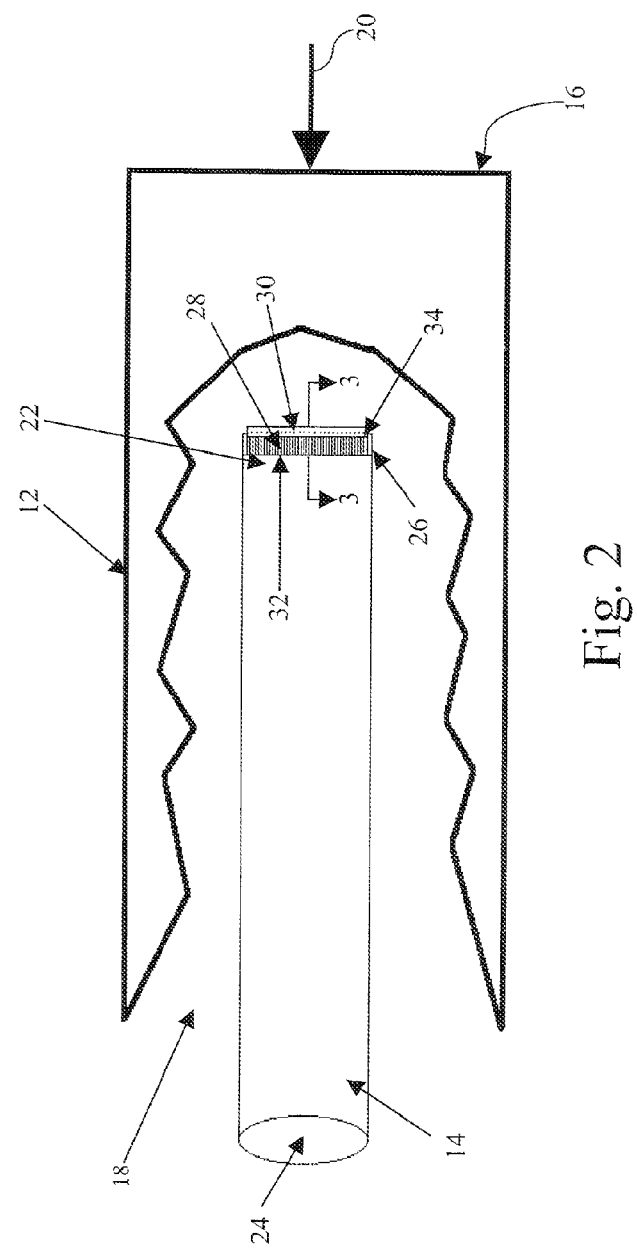

CONTINUOUS GROWTH OF SINGLE-WALL CARBON NANOTUBES USING CHEMICAL VAPOR DEPOSITION

CROSS-REFERENCE TO RELATED APPLICATION

This application is a divisional of and claims priority to U.S. patent application Ser. No. 10/700,386, filed Nov. 3, 2003, now U.S. Pat. No. 7,431,965, which claims priority from U.S. Ser. No. 60/422,860, filed Nov. 1, 2002, and U.S. Ser. No. 60/444,979, filed Feb. 5, 2003, and which applications are incorporated herein by reference in their entirety.

CONTRACTUAL ORIGIN OF THE INVENTION

The United States Government has rights in this invention under Contract No. CRD-98-076 between the United States Department of Energy and the National Renewable Energy Laboratory, a Division of the Midwest Research Institute.

FIELD OF INVENTION

The invention relates to a chemical vapor deposition ("CVD") process for the growth of carbon single-wall nanotubes ("SWNT") where a carbon-containing gas composition is contacted with a catalyst on a porous membrane and decomposed in the presence of the catalyst to continuously grow SWNT material. The invention also relates to an apparatus used with the CVD process.

BACKGROUND

Fullerenes were discovered in 1985 by Curl, Kroto, and Smalley, and carbon nanotubes were discovered a few years later by Sumio Iijima in 1991. See Kroto, H. W., Heath, J. R., O'Brien, S. C., Curl, R. F. and Smalley, R. E. "$C_{60}$: Buckminsterfullerene", Nature, 318, 162-163 (1985) and Iijima, "Helical Microtubules of Graphitic Carbon", Nature, 354(7), 56-58 (1991). Since these discoveries, much research has been devoted to learning more about the physical and chemical properties of carbon nanotube materials, as well as potential applications for these materials. However, research has been limited by the lack of a practical method for producing high quality SWNT on a large scale and at a reasonable cost.

The most common methods for the preparation of single wall carbon nanotube material include laser evaporation, electric arc discharge, and chemical vapor deposition methods. However, each of the techniques developed to date has various shortcomings for the large-scale production of high purity SWNT material.

Laser evaporation of graphite has been used to produce SWNT material. In such a process, a laser is used to vaporize a heated carbon target that has been treated with a catalyst metal. In Guo, T. et al., Chem. Physics Letters 243, 49 (1995), and Bandow, S. et al., Physical Review Letters, 80(17), 3779-3782 (1998), a graphite rod having cobalt or nickel dispersed throughout is placed in a quartz tube filled with about 500 Torr of argon, followed by heating to 1200° C. A laser is then focused on the upstream side of the quartz tube from the tip to heat the carbon rod and evaporate it. Carbon nanotubes are then collected on the downstream side of the quartz tube. Laser ablation of a heated target is reported in Thess, A. et al., Science, 273, 483-487 (1996), where a laser is used to vaporize a heated carbon target that has been treated with a catalyst metal such as nickel, cobalt, iron, or mixtures thereof.

An electric arc discharge method for preparation of SWNT has been reported in Iijima, Nature, 354(7), 56-58 (1991) or Wang et al., Fullerene Sci. Technol., 4, 1027 (1996), for example. In this method, carbon graphite is vaporized by direct-current electric arc discharge, carried out using two graphite electrodes in an argon atmosphere at approximately 100 Torr. SWNT grow on the surface of the cathode.

Chemical vapor deposition approaches for growing SWNT material typically use methane, carbon monoxide, ethylene or other hydrocarbons at high temperatures with a catalyst. Chemical vapor deposition of an aerogel supported Fe/Mo catalyst at 850-1000° C. is reported, for example, in J. Kong, A. M. Cassell, and H. Dai, Chemical Physics Letters, 292, 567-574 (1998) and Su, M., Zheng, B., Liu, J., Chemical Physics Letters, 322, 321-326 (2000). The chemical vapor deposition of methane over well-dispersed metal particles supported on MgO at 1000° C. is reported in Colomer, J.-F., et al., Chemical Physics Letters, 317, 83-89 (2000). In Japanese Patent No. 3007983, a CVD process for production of carbon nanotubes is reported where a hydrocarbon is decomposed at 800-1200° C. in a reactor containing a catalyst comprising molybdenum or a metal molybdenum-containing material. In addition to the above methods, a carbon fiber gaseous phase growth method has been reported in WO 89/07163, where ethylene and propane, with hyperfine metal particles are inducted to produce SWNT at 550-850° C.

WO 00/17102 discloses that SWNT material can be prepared by catalytic decomposition of a carbon-containing compound, (e.g., carbon monoxide and ethylene), over a supported metal catalyst at initial temperatures of about 700° C. to about 1200° C., preferably an initial temperature of 850° C. WO 00/17102 asserts that "the mass yield of SWNT is temperature dependent, with the yield increasing with increasing temperature" at page 13, lines 18-19.

EP 1,061,041 teaches a low-temperature thermal chemical vapor deposition apparatus and method of synthesizing SWNTs using the apparatus. This apparatus has a first region, maintained at a temperature of 700° C. to 1000° C., and a second region maintained at 450-650° C. In this process, a metal catalyst is used with a hydrocarbon gas having 1-20 carbon atoms as the carbon source, preferably acetylene or ethylene.

The methods developed to produce SWNT, however, have various shortcomings. Such methods for preparing carbon nanotubes are not only expensive, but also fail to provide carbon nanotubes in high yields or in a cost effective manner. Moreover, the current methods in the art often produce a material of low purity and/or low quality. In current prior processes, SWNT is typically produced by high temperature processes, often with concomitant formation of significant amounts of amorphous carbon or non-nanotube carbon, which typically results in low yields and requires extensive purification steps. The purification techniques themselves often contribute to the low yields by causing damage or breakage of the carbon nanotubes. As a result, the current processes for making SWNT material are expensive and generally prohibit large-scale production of SWNT material.

Additionally, in the methods known in the art, SWNT growth occurs only for a relatively short period of time. This relatively short period of SWNT growth can largely be attributed to the formation of carbon residue from the hydrocarbon gas used in the CVD process. The carbon residue may form detrimentally on the surface area of catalyst that is not presently growing SWNT, which, once becoming covered with carbon residue, cannot grow new SWNT. Replenishing the catalyst supply is then needed to achieve further SWNT growth. However, replenishing the catalyst supply is both expensive and time consuming.

Thus, what is needed in the art is a process for the production of SWNT that allows SWNT growth to be continuous in the sense that the SWNT can grow for significantly longer periods of time without the need to replenish the catalyst. Under such a system, the SWNT yield, defined as the amount of SWNT growth per gram of catalyst, would be dramatically increased. The process should preferably produce high quality SWNT material that allows for the high-yield SWNT growth to continue to grow past the period of time when the typical SWNT is normally prevented. The new processes and new apparatus for producing SWNT disclosed in this invention provide a new geometry/arrangement for SWNT growth that answers such a need.

SUMMARY

One aspect of this invention relates to a chemical vapor deposition process for the preparation of a single-wall carbon nanotube by contacting a carbon-containing gas composition with a catalyst on a porous membrane at a temperature sufficient to decompose the carbon-containing gas composition in the presence of the catalyst causing growth of a single-wall carbon nanotube. The porous membrane has a first side and a second side, wherein the first side is opposite the second side, and wherein a thin catalyst layer is present on at the first side of the porous membrane. A pressure differential exists across the porous membrane such that the pressure on the second side is less than that on the first side. The SWNT growth may occur on the second side of the porous membrane or between the catalyst and the first side of the porous membrane.

A second aspect of this invention relates to a chemical vapor deposition process for producing a single-wall carbon nanotube by contacting a catalyst comprising aluminum oxide, iron and molybdenum with a carbon-containing gas composition comprising methane, hydrogen and an inert gas to produce a single-wall carbon nanotube.

A third aspect of this invention relates to an apparatus for conducting a chemical vapor deposition process comprising a first tube and a second tube. The first tube can be disposed at least within a portion of the second tube, and the first tube has two openings: a first opening and a second opening. The first opening faces the interior of the second tube and the second opening is coupled to a vacuum. A porous membrane is contiguous to the first opening, and a thin catalyst layer is contiguous to at least a portion of the porous membrane that faces the interior of the second tube. A preferred apparatus is illustrated in the drawings.

In another aspect of the invention, an apparatus for conducting a chemical vapor deposition process is provided wherein the apparatus comprises a porous membrane, a catalyst deposited as a thin layer on one side of the porous membrane, and a pressure differential across the membrane wherein pressure on one side of the membrane is less than the pressure on the other side of the membrane. The catalyst can be on either side of the membrane.

BRIEF DESCRIPTION OF THE DRAWINGS

The accompanying drawings, which are included to provide a further understanding of the invention and are incorporated in and constitute a part of this specification, illustrate preferred embodiments of the invention and together with the detailed description serve to explain the principles of the invention.

FIG. 1 is a perspective view of a chemical vapor deposition apparatus constructed in accordance with the principles of the invention.

FIG. 2 is a side view of the apparatus shown in FIG. 1 with a partial break-away view to show inside the outer tube.

FIG. 3 is a cross-section taken along line 3-3 in FIG. 2.

DETAILED DESCRIPTION

This invention relates to a chemical vapor deposition process for the continuous production of single-wall carbon nanotubes (SWNT). According to the invention, SWNT is produced by contacting a carbon-containing gas with a porous membrane having a first and second side. On the first side of the membrane is a thin layer of catalyst. In the process, a pressure differential exists across the porous membrane such that the pressure on the second side of the porous membrane is lower than that on the first side. The carbon-containing gas contacts the catalyst on the membrane at a temperature sufficient to decompose the carbon-containing gas in the presence of the catalyst, causing SWNT growth.

Porous Membrane

The porous membrane used in this invention comprises a membrane that is both physically strong and sufficiently porous enough to act as an effective porous membrane, provided that the chemical composition of the membrane does not react with the carbon-containing gas composition or catalyst used in the CVD process.

The porous membrane must be strong enough to withstand the pressure differentials and high temperatures of a typical carbon vapor deposition process. At a minimum, the membrane must be able to withstand temperatures of 600° C. and pressure differentials of 50 Torr for the duration of a suitable period of use.

The membrane must also be porous enough to allow SWNT to grow through it, but not so porous that it becomes ineffective at holding the catalyst. The membrane becomes ineffective when the pores are so large that that the catalyst will be unable to sustain its position on the membrane when introduced to the pressure differentials, discussed below in detail. Quantitatively, the pore size of the membrane should be less than about 2 micron in diameter; preferably, less than 1 micron; more preferably, less than 500 nm; and most preferably, less than 250 nm.

The porous membrane should not adversely react with the carbon-containing gas composition, SWNT material, or catalyst used in the CVD, and preferably is a chemically inert material, such as alumina, stainless steel, or a ceramic. Chemically reactive materials, such as nickel, molybdenum, iron, or cobalt should not be used because these materials will react with either the catalyst or the carbon-containing gas composition.

Stainless steel exhibits stronger physical parameters than alumina (it does not break apart as easily), but currently is not available in a pore size less than 1 micron in diameter. Alumina, while not as physically strong as stainless steel, is available in the smaller porosity levels. Therefore, depending on the reaction conditions, if the desired pore size is greater than 1 micron, stainless steel is the preferred membrane; on the other hand, if it is important to the invention that the porosity of the membrane be less than 1 micron, alumina is the preferred membrane. However, both alumina and stainless steel are suitable for most aspects of this invention, and furthermore, as set forth above, any membrane system that has the requisite mechanical strength and contains satisfactory porosity may be used with the chemical vapor deposition processes of this invention, provided it does not chemically react with the catalyst or the carbon-containing gas composition.

Catalyst Composition

The catalyst composition may be any catalyst composition known to those of skill in the art that is routinely used in chemical vapor deposition processes. Examples of known catalysts systems are provided on page 2, paragraph 7, herein incorporated by reference. The catalyst can be a metal selected from a Group V metal, such as V or Nb, and mixtures thereof, a Group VI metal including Cr, W, or Mo, and mixtures thereof, VII metal, such as, Mn, or Re, Group VII metal including Co, Ni, Ru, Rh, Pd, Os, Ir, Pt, and mixtures thereof, or the lanthanides, such as Ce, Eu, Er, or Yb and mixtures thereof, or transition metals such as Cu, Ag, Au, Zn, Cd, Sc, Y, or La and mixtures thereof. Specific examples of mixture of catalysts, such as bimetallic catalysts, which may be employed by the present invention include Co—Cr, Co—W, Co—Mo, Ni—Cr, Ni—W, Ni—Mo, Ru—Cr, Ru—W, Ru—Mo, Rh—Cr, Rh—W, Rh—Mo, Pd—Cr, Pd—W, Pd—Mo, Ir—Cr, Ir—W, Pt—W, and Pt—Mo. Preferably, the catalyst is iron, cobalt, nickel, molybdeum, or a mixture thereof, such as Fe—Mo, Co—Mo and Ni—Fe—Mo. The metal or combination of metals selected as the catalyst can be processed to obtain the desired particle size and diameter distribution.

In another aspect, the catalyst is supported on a material suitable for use as a support during synthesis of carbon nanotubes using the metal growth catalysts described below. As known in the art, the support can be used to separate the catalyst particles from each other, providing the catalyst materials with greater surface area in the catalyst composition. Such materials include powders of crystalline silicon, polysilicon, silicon nitride, tungsten, magnesium, aluminum and their oxides, preferably aluminum oxide, silicon oxide, magnesium oxide, or titanium dioxide, or combination thereof, optionally modified by addition elements, are used as support powders. Silica, alumina and other materials known in the art may be used as the support, but alumina is the preferred support. Other catalysts components, including other metals, known to those of skill in the art for use in chemical vapor deposition processes may be included in the catalyst composition. Thus, preferably, the catalyst composition comprises the metal, such as iron, molybdenum or combinations thereof, and a support.

The molar ratio of support to metal, such as iron, typically ranges from about 50:1 to about 2:1; preferably from about 25:1 to about 3:1; and most preferably at about 9:1. The molar ratio of support to molybdenum typically ranges from about 125:1 to about 5:1; preferably from about 75:1 to about 10:1; and most preferably at about 27:1. The molar ratio of iron to molybdenum typically ranges from about 15:1 to about 1:2; preferably from about 10:1 to about 1:1; and most preferably at about 3:1. In a preferred embodiment, the catalyst composition comprises alumina, iron and molybdenum used in a 9:1:1/3 ratio.

While alumina is a preferred support in the catalyst composition, alumina is also, as discussed above, a preferred composition for the porous membrane. As known to those of skill in the art, the alumina used as a membrane is different from the type of alumina used as a support with the catalyst composition. While this difference is difficult to describe in words, one skilled in the art would know which type of alumina should be used for the membrane and which type of alumina should be used for the support. Nonetheless, both types of alumina may be utilized together (one as the catalyst support and one as the porous membrane) or separately.

The catalyst composition is applied as a thin catalyst later to a porous membrane, and can be on placed either on the low pressure side and/or the high pressure side of the apparatus. Preferably, the catalyst composition is applied at least to the high-pressure side of the porous membrane so that it forms a thin catalyst layer on the surface of the membrane. Preferably, the catalyst is applied to only the high-pressure side of the membrane. Thus, when the catalyst is on the high-pressure side of the membrane, the SWNT growth will be away from the membrane, but when the catalyst is on the low-pressure side of the membrane, the SWNT growth will be through the membrane. Thus, the SWNTs can be grown on either the low pressure side or the high pressure side of the apparatus by using the preferred pressure ranges and differential ranges described below, and by placing the catalyst composition on the porous membrane that either faces the high-pressure side or faces the low-pressure side.

The catalyst composition should be applied in a manner so that the catalyst is evenly spread across the surface of the membrane to produce a thin homogeneous layer of catalyst on that surface. One possible means of accomplishing this involves spreading the catalyst composition across the membrane surface, for example with a spatula, or similar device. This operation is preferably performed under a microscope. During the application process, the application device, e.g., the spatula, may also be used to evenly distribute the catalyst composition across the membrane. The magnification produced by the microscope better ensures that uniformity of the catalyst layer is achieved. Other application techniques that produce the same result may also be used.

The amount of membrane surface area covered by the catalyst directly corresponds with total SWNT production. Therefore, while one may choose to only apply the catalyst composition to only a small portion of the membrane, it is preferred that the catalyst be applied to largest amount of membrane surface area available. When using the preferred apparatus (shown if FIG. 1 and described below), a portion of the membrane will be covered by the thickness of the inner tube. As such, it may be prudent to refrain from applying the catalyst composition to this area of the membrane, although doing so has not produced any detrimental result, other than the added expense of using and applying the extra catalyst composition.

Substantial benefits have been seen when applying the catalyst composition to the entire viable surface area of the high-pressure side of the membrane. Most notably, the carbon gas composition cannot as easily seep through non-catalyst covered pores in the membrane, travel into the low-pressure side of the membrane, and assail itself on the catalyst through the low-pressure side. Thus, the carbon gas composition-catalyst reaction takes place largely via the high-pressure side of the membrane.

When the surface area of the membrane is not completely covered, the carbon-containing gas composition-catalyst reaction via the low-pressure side of the membrane occurs with much greater frequency. This reaction, while producing some SWNT that may be harvested, also detrimentally deposits carbon residue on available catalyst sites. The carbon deposition effectively clogs the growth of future SWNT, requiring the catalyst to be replenished before additional SWNT growth may occur.

When the catalyst composition is applied to the entire surface area of the high-pressure side of the membrane, there are fewer pores in the membrane available for the carbon-containing gas composition to enter the low-pressure side of the membrane. With only one side of the catalyst susceptible to the carbon-containing gas composition, SWNT growth may occur on the opposite side without, to a large degree, the inhibitions described above; i.e., carbon deposits that clog available catalyst sites. Since the pores of the membrane remain open to grow the SWNT, more SWNT grows. The existing SWNT continues to grow when carbon deposits do not impede their growth. Thus, this aspect of the invention provides for continuous growth of SWNT. While traditional CVD processes only provide from 15 minutes to one hour of SWNT growth before the catalyst needs to be replenished, this continuous growth CVD processes provides SWNT growth for up to ten hours or more. Thus, applying the catalyst composition to the entire high-pressure side of the membrane is a preferred and advantageous embodiment of the invention.

As described below in detail, SWNT growth may occur on the low-pressure side of the membrane, between the catalyst and membrane, or both. With regard to the thickness of the catalyst layer, if it is desired that SWNT growth occur predominately on the low-pressure side of the membrane, the catalyst layer should generally be thin, preferably less than 5 mm in thickness. Whereas, if significant SWNT growth is desired in between the catalyst and the membrane, the catalyst layer should be thicker, in the range of 5 mm or greater. The 5 mm standard, while representing the best estimate, has not been quantitatively measured. Therefore, in practice, one skilled in the art may find that the actual thickness varies, especially when the other parameters discussed throughout this disclosure are factored into the process. While the thin catalyst layer may be less than 5 mm in thickness, there is a point where the thin catalyst layer may become too thin. If the thin catalyst layer is too thin, it will not be able to withstand the pressure differential on the two sides of the membrane, lose its position on the membrane, and collapse into the low-pressure side. Thus, the catalyst layer should have a minimum thickness to allow for SWNT growth.

Carbon-Containing Gas Composition

The carbon-containing gas composition may be any gas composition wherein at least one gas in the composition is a carbon-containing gas; i.e., a gas that contains only hydrogen and carbon atoms. Carbon-containing gases known in the art, such as methane, carbon monoxide, ethylene, propane and combinations thereof may be used. Preferably, the carbon-containing gas is methane. When using methane, commercially available high-grade methane gas, for example, 99% purity or higher, is typically used.

The carbon-containing gas composition may also contain hydrogen gas and an inert gas, and preferably, both of these gases are present in the carbon-containing gas composition. Typical inert gases include argon, nitrogen, helium, neon, and mixtures thereof. Preferably, the inert gas is argon. Other gases known to those of skill in the art for use in chemical vapor deposition processes may also be included in the carbon-containing gas composition.

Typically, the ratio between the methane gas and hydrogen gas ranges from about 5:1 to about 1:5 by volume, preferably from about 3:1 to about 1:3, and most preferably at about 1:1; the ratio between the methane gas and inert gas ranges from about 1:2 to about 1:50 by volume, preferably from 1:3 to about 1:25, and most preferably at about 1:10; the ratio between hydrogen gas and inert gas ranges from about 1:2 to about 1:50 by volume, preferably from 1:3 to about 1:25, and most preferably from at 1:10. When the carbon-containing gas composition contains methane gas, hydrogen gas and inert gas, the ratio among the three gases is most preferably about 1:1:10 by volume.

The carbon-containing gas may be introduced at the high-pressure side of the porous membrane and then drawn into the membrane by the pressure differential. The components of the carbon-containing gas that do not react with the catalyst may be drawn away from the reaction as an exhaust gas.

CVD Process Parameters

Other conditions present in this chemical vapor deposition process, such as temperature conditions, may vary in accordance with chemical vapor deposition processes known to those of skill in the art. Chemical vapor deposition is well known in the art, and described in detail in handbooks such as Pierson, H. O., Handbook of CVD Principles: Techniques and Applications, William Anderson LLP, New York, N.Y. (1999), herein incorporated by reference in its entirety. Preferably, the temperature used in the processes of this invention ranges from about 400° C. to about 1200° C., or more preferably about 670° C. to about 800° C. Typically, the carbon-containing gas composition is heated up while traveling through a furnace, without a pre-heating step, and then used in the invention. However, various other heating techniques known to those of skill in the art may also be used.

The gas flow rate should preferably be from about 200 to about 500 sccm for the inert gas and from about 20 to about 60 sccm for the carbon-containing and hydrogen gases. As an example, a chemical vapor deposition process may be run at a flow rate of about 400 sccm for argon, 40 sccm for hydrogen, and 40 sccm for methane. As one of skill in the art will recognize, the flow rate can be adjusted as appropriate, such as when large reactors are employed, to generate SWNTs.

Pressure Differential

A pressure differential on the two sides of the membrane should exist. The pressure differential should range from about 50 to about 600 Torr, preferably 150 to 400 Torr and most preferably about 200 to 300 Torr. On the low-pressure side of the membrane, the pressure should range from about $10^{-3}$ to about 600 Torr, preferably about 100 to about 500 Torr, and most preferably from about 300 to about 400 Torr. On the high-pressure side of the membrane, the pressure should range from about 100 to about 800 Torr, preferably from about 400 to about 750 Torr, and most preferably from about 600 to about 700 Torr. While the pressure in the low and high-pressure sides may be within the above ranges, the low-pressure side may not have a pressure higher than the high-pressure side, and the difference between both sides must be within the pressure-differential range set forth above. Experimental results have shown that more SWNT growth occurs on the low-pressure side of the membrane when the preferred pressure ranges and differential ranges are used.

The pressure differential may be achieved by reducing the pressure on the second side of the porous membrane. Reducing the pressure on the second side of the membrane may be achieved by creating a vacuum on the second side of the membrane.

SWNT Growth

The formation of SWNT may take place at different locations in relation to the catalyst and membrane, each of these locations representing a different embodiment of this invention.

In one embodiment, SWNT forms on the low-pressure side of the membrane. SWNT growth may occur on the low-pressure side of the membrane by growing through the porous membrane and into the low-pressure side. Therefore, this embodiment relates to a chemical vapor deposition process for the preparation of a SWNT comprising contacting a carbon-containing gas composition with a porous membrane having a thin catalyst layer on a first side of the porous membrane at a temperature sufficient to decompose the carbon-containing gas composition in the presence of the catalyst causing growth of a SWNT predominately on a second side of the porous membrane opposite the first side, wherein a pressure differential exists across the porous membrane, the pressure on the second side being less than that on the first side.

When this type of SWNT growth occurs, harvesting SWNT takes place on the low-pressure side of the membrane. Harvesting SWNT may be performed by a simple three-step procedure: (1) carefully disassemble the apparatus used to grow the SWNT so as to expose the SWNT; (2) using a suitable instrument, dislodge the SWNT from its attached location at the membrane; and (3) collect the dislodged SWNT. Other techniques known to those of skill in the art may also be used. Once harvested, SWNT may be purified using techniques known in the art to remove catalyst residue and other impurities collected with the SWNT.

Harvesting SWNT when it grows through the membrane and forms on the low-pressure side of the membrane may be performed with relative ease, as the majority of the catalyst will still remain applied to the high-pressure side of the membrane during the harvesting process. Trace elements of the catalyst may be present in the SWNT growth occurring on the low-pressure side of the membrane, but it has been found that the majority of the catalyst tends to stay on the high-pressure side the membrane, its original application site.

In another embodiment, SWNT forms between the catalyst and the membrane within the high-pressure side of the membrane. In this embodiment, the majority of SWNT does not grow through the porous membrane, but remains on the high-pressure side of the membrane, predominately growing in between the catalyst and the high-pressure side of the membrane. Therefore, this embodiment relates to a chemical vapor deposition process for the preparation of a SWNT comprising contacting a carbon-containing gas composition with a porous membrane having a first side and a second side, wherein the first side is opposite to the second side and a thin catalyst layer is present on the first side, at a temperature sufficient to decompose the carbon-containing gas composition in the presence of the catalyst causing growth of a SWNT, wherein the growth predominately occurs between the catalyst and the first side of the porous membrane, and wherein a pressure differential exists across the porous membrane, the pressure on the second side being less than on the first side.

When SWNT grows between the catalyst and the high-pressure side of the membrane, most of the catalyst still remains applied to the membrane, but comparatively larger amounts of the catalyst appear in the SWNT growth, as more of the catalyst is pushed away from the membrane with the SWNT growth. That is, as the SWNT grows into the high-pressure side of the membrane, some of the catalyst that was previously applied to the high-pressure side of the membrane will be forced away from the membrane through the growth of the SWNT. Harvesting SWNT growth that occurs between the catalyst and the membrane may be performed by procedures similar to those used to harvest SWNT growth on the low-pressure side of the membrane. When harvesting SWNT growth between the catalyst and membrane, more catalyst residue generally appears in the harvested SWNT, so longer or different purification techniques may be necessary. Also, since there is not a membrane separating the SWNT growth from the catalyst applied to the membrane, greater skill is often required to harvest the SWNT without also including significant amounts of catalyst with the SWNT harvest. Indeed, harvesting all or nearly all of the SWNT formed in between the catalyst and the membrane is, in many cases, an art form.

SWNT growth may occur on the low-pressure side of the membrane or in between the catalyst in the high-pressure side. The SWNT growth may occur predominately in one location or the other, or occur in equal amounts in each of these two locations. As used throughout this application, the term "predominant" means at least 50% of the total SWNT growth. A carbon vapor deposition process that produces 50% SWNT growth on the low-pressure side of the membrane and 50% SWNT growth between the catalyst and the high-pressure side of the membrane is encompassed by both embodiments of the processes set forth above.

It is desirable to limit SWNT growth in certain areas while producing SWNT growth in other preferable areas. Growth stemming from predominately one side of the catalyst membrane is desirable for reasons relating to collection and purification, as well as other reasons that will be appreciated by those of skill in the art. It is a preferred aspect of this invention that the growth occurs on the low-pressure side of the membrane with limited growth between the catalyst and membrane. However, it is recognized in another embodiment of this invention that significant SWNT growth may occur in between the catalyst and membrane, and that growing and harvesting the SWNT growth in this area is economically viable.

While the SWNT growth may occur at different locations, the general reaction conditions for each embodiment are largely the same. Conditions relating to the pressure differential existing across the membrane, the carbon-containing gas composition, the gas flow rate, the porous membrane, the catalyst composition, and the temperature, all discussed above in detail, may each individually be used for each embodiment of the chemical vapor deposition process.

Moreover, some of the above-described inventive chemical vapor deposition processes may also be carried out with apparatuses known in the art, such as the "quartz boat" process and those described in U.S. patent application Ser. No. 09/825,870, herein incorporated by reference in its entirety. The "quartz boat" carbon vapor deposition process entails providing a boat, usually made of quartz, that contains a catalyst. The boat is placed in furnace-like conditions so that chemical vapor deposition may take place when a carbon-containing gas is passed over the catalyst. When the carbon-containing gas is passed over the catalyst-containing boat, SWNT forms on top of the catalyst inside the boat. In particular, the catalyst composition, described above, may be used with the "quartz boat" process and other CVD processes known in the art.

Collection and Purification of SWNT Material

After the SWNT material is grown, the SWNT material is collected, and it may be desirable to optionally purify the material. For a general discussion of purification of SWNT material, see A. Dillon, "*A Simple and Complete Purification of Single-Walled Carbon Nanotube Materials*", *Adv. Mater.*, 11(16) (1999). For example, the final products may be treated with an aqueous solution (e.g. typically in concentrations from about 1-5M) of an inorganic acid, such as a mineral acid to remove any excess catalyst particles. Suitable mineral acids include, for example, sulfuric acid, nitric acid, and hydrochloric acid.

Other suitable methods for purifying SWNT material known in the art may also be used. Examples of such methods include the use of oxidants, burning, and surfactants. Care should be taken with such methods to minimize unwanted side reactions such as breaking of chemical bonds of the SWNT and poor yields.

Analysis and Characterization of SWNT Material

A single wall carbon nanotube is a molecule formed primarily from $sp^2$-hybridized carbon atoms bound together in the shape of a hollow tube that is capped at each end. Typically, for example, the carbon nanotubes will be made of tubes of graphite sheet capped with half a fullerene molecule on each end. Carbon nanotubes are further classified as either single wall carbon nanotubes ("SWNT") or multiple wall carbon nanotubes ("MWNT"). SWNT are one atomic carbon layer in thickness and MWNT are more than one atomic carbon layer in thickness. Typically, a SWNT has a diameter of less than about 3 nm, while a MWNT has a diameter of greater than about 2.5 nm.

The SWNT material that is produced according to the invention may be characterized by a variety of methods known to one of ordinary skill in the art. For example, SWNT material is typically characterized by techniques such as Raman spectroscopy. The Raman technique for analysis of SWNT is described, for example, in Dillon et al., "*A Simple and Complete Purification of Single-Walled Carbon Nanotube Materials*", *Adv. Mater.* 11(16), 1354-1358 (1999). Purified SWNT material shows two strong Raman signals (tangential modes) at about 1593 and 1567 $cm^{-1}$. These signals will increase in intensity as the material is purified and the percent of SWNT material increases. A signal at 1349 $cm^{-1}$ ("D-band") in the crude material is tentatively assigned to the presence of impurities and defects in the nanotube walls.

Chemical Vapor Deposition Apparatus

The above described chemical vapor deposition processes are preferably carried out using a chemical vapor deposition apparatus shown generally at 10 in FIG. 1. CVD apparatus 10 generally includes two concentric hollow tubes, outer tube 12 and inner tube 14. The tubes 12, 14 have a substantially circular cross-section, but other shapes can be used in accordance with the invention.

Referring to FIG. 2, the outer tube 12 is preferably made of quartz and is capable of being heated to temperatures of 1200° C. or greater. The outer tube 12 may also be made of alumina or stainless steel, or other chemically inert metals known to those of skill in the art. Quartz is preferred because it is transparent. Outer tube 12 is sealed and has an inlet end 16 and an outlet end 18. The carbon-containing gas composition, as described above and illustrated by arrow 20 in FIG. 2, is input into inlet end 16 via a standard gas connection, known well to those of skill in the art.

The inner tube 14 is preferably made of stainless steel and has an inlet end 22 and an outlet end 24. The inner tube 14 may also be made of alumina or quartz, or other chemically inert metals known to those of skill in the art. Stainless steel is preferred because it may be polished at inlet end 22, providing a smoother and tighter union with the porous membrane 28. The inner tube 14 is partially disposed in the outer tuber 12. As illustrated, the inlet end 22 is disposed inside outer tube 12 and the outlet end 24 is disposed outside of the outer tube 12. Other materials known to those of skill in the art may be utilized for the make-up of the outer and inner tubes, provided they have the ability to withstand the temperature and pressure conditions associated with chemical vapor deposition as performed in accordance with the principles of the invention, and provided that they are chemically inert with regard to the catalyst and carbon-containing gas composition.

The inlet end 22 of inner tube 14 has a closure shown generally at 26, including a porous membrane 28 coated with a catalyst layer 30. The details of the preferred porous membrane and catalyst are described above and not repeated here. Preferably when chemical vapor deposition is used with this apparatus 10, the catalyst layer 30 is coated on the membrane 28. The porous membrane 28 is preferably held to the inlet end 22 through the pressure differential created by the vacuum. The porous membrane 28 may also be attached or bonded to the inlet end 22 by other conventional attachment method, provided the bonding material does not chemically react with the carbon-containing gas composition or the catalyst, and provided the bond can withstand the process conditions, such as the temperatures and pressure differential. The porous membrane 28 as shown may have the shape of a flat disc and can be used in varying thicknesses. Membrane 28 has two opposing sides 32, 34. Side 32 faces in the direction of the outlet end 18 of outer tube 12, i.e., toward the interior of the inner tube 14 and the other opposing side 34 faces in the direction of inlet end 16 of outer tube 12 and is coated with the catalyst layer 30. A process used to coat the membrane 28 with the catalyst layer 30 is described above in detail. Preferably the entire surface of side 34 is coated, with the exception of the surface area that overlaps with the thickness of inner tube 14. Coating coverage and thickness of the catalyst layer 30 may vary in accordance with the principles of the invention as described above. The coating is preferably applied before the membrane 28 is attached to the inlet end 22.

The outlet end 24 of inner tube 14 is coupled to a vacuum pump (not shown) to create a vacuum or low pressure inside inner tube 14. Any pressure can be used such that it is sufficient to draw gases 20 through the closed end 26 and in accordance with preferred pressures are described above.

The apparatus functions as a too! of achieving SWNT growth predominately in a single direction. As discussed above in detail, a novel method of growing SWNT has been discovered wherein the arrangement of the catalyst and system supporting the catalyst (membrane) enable the continuous growth of SWNT. As a pressure differential exists in this system, the preferred apparatus was created as a means of achieving this new type of SWNT growth that best controls the pressure differential across the membrane to produce high-yield SWNT growth and prevent catalyst coating by non-nanotube carbons.

In operation, the membrane 28 preferably cinctures the inlet end 22 of inner tube 14 so that when the outlet end 24 is coupled to a vacuum, a satisfactory pressure differential is created on the two sides of the membrane, as described above. When the pressure differential is created, the pressure in the inner tube 14 will be different than the pressure that is inside the outer tube 12. Because, as shown, the inner tube 14 is disposed within at least a portion of the outer tube 12, when a carbon-containing gas composition, for example, as illustrated by arrow 20, flows through the interior of the outer tube 12, the carbon-containing gas composition may either contact the catalyst-covered membrane 28, or may continue to flow through the outer tube 12, past the membrane 28 into an exhaust hood (not shown). When the carbon-containing gas composition contacts the catalyst coating 30 on the membrane 28, SWNT growth occurs as described above in detail.

Other constructions and configurations of this apparatus can be used to carry out the chemical vapor deposition processes described herein, as long as the apparatus has the ability to create a pressure differential across the catalyst-coated porous membrane.

All the patents, journal articles and other documents discussed or cited above are herein incorporated by reference.

The claimed invention is:

1. An apparatus for conducting a chemical vapor deposition process, comprising:
    a first tube and a second tube, said first tube disposed at least within a portion of the second tube, said first tube including a first opening and a second opening, said first opening facing the interior of the second tube, and said second opening being coupled to a vacuum;

a porous membrane contiguous to the first opening, said porous membrane having a first side and a second side, wherein the first side is opposite the second side and the first side faces the interior of the second tube; and a thin catalyst composition layer is present on at least the first side of said porous membrane wherein said thin catalyst composition layer comprises alumina, iron and molybdenum in a 9:1:1/3 molar ratio.

2. The apparatus of claim 1, wherein said porous membrane cinctures said first opening.

3. The apparatus of claim 1, wherein said porous membrane has a pore size less than 2 micron.

4. The apparatus of claim 1, wherein said porous membrane has a pore size less than 500 nm.

5. The apparatus of claim 1, wherein said porous membrane comprises alumina or stainless steel.

6. The apparatus of claim 1, wherein said membrane comprises alumina and has a pore size less than 500 nm.

* * * * *